(12) United States Patent
Han

(10) Patent No.: US 10,157,651 B2
(45) Date of Patent: Dec. 18, 2018

(54) SEMICONDUCTOR DEVICE FOR DRIVING DATA LINE BY USING DIFFERENT VOLTAGES

(71) Applicant: SK hynix Inc., Gyeonggi-do (KR)

(72) Inventor: Min-Sik Han, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 168 days.

(21) Appl. No.: 15/008,233

(22) Filed: Jan. 27, 2016

(65) Prior Publication Data

US 2017/0069355 A1 Mar. 9, 2017

(30) Foreign Application Priority Data

Sep. 4, 2015 (KR) .................... 10-2015-0125569

(51) Int. Cl.
*G11C 7/00* (2006.01)
*G11C 7/12* (2006.01)
*G11C 7/10* (2006.01)

(52) U.S. Cl.
CPC .............. *G11C 7/12* (2013.01); *G11C 7/106* (2013.01); *G11C 7/1048* (2013.01); *G11C 7/1087* (2013.01)

(58) Field of Classification Search
CPC ....... G11C 7/12; G11C 7/1087; G11C 7/1048; G11C 7/106
USPC ...................................... 365/189.11
See application file for complete search history.

(56) References Cited

U.S. PATENT DOCUMENTS 5,084,637 A * 1/1992 Gregor ........... H03K 19/018592
326/30
7,266,030 B2 * 9/2007 Do ........................ G11C 7/065
365/145

FOREIGN PATENT DOCUMENTS

KR 1020110121350 11/2011

* cited by examiner

*Primary Examiner* — Tha-O H Bui
(74) *Attorney, Agent, or Firm* — IP & T Group LLP

(57) ABSTRACT

A semiconductor device may include an input/output block suitable for operating by using a first voltage in an input mode and a second voltage in an output mode, a common input/output line coupled to the input/output block, and a voltage level maintaining block suitable for driving the common input/output line to maintain a voltage level of a transmission signal by using the first voltage in the input mode and the second voltage in the output mode.

16 Claims, 5 Drawing Sheets

SEMICONDUCTOR DEVICE FOR DRIVING DATA LINE BY USING DIFFERENT VOLTAGES

CROSS-REFERENCE TO RELATED APPLICATIONS

The present application claims priority of Korean Patent Application No. 10-2015-0125569, filed on Sep. 4, 2015, which is incorporated herein by reference in its entirety.

BACKGROUND

1. Field

Exemplary embodiments of the present invention relate to a semiconductor design technology and, more particularly, to a semiconductor device.

2. Description of the Related Art

Recent advances in computer, and electronic communication technologies demand ever increasing miniaturization and higher capacity for semiconductor devices included in electronic appliances used in conjunction with such technologies. Also, as users' requirements for energy efficiency increase, semiconductor devices have to be developed in ways that reduce power consumption.

Semiconductor devices such as, for example, a Double Data Rate Synchronous Dynamic Random Access Memory (DDR SDRAM) may include multiple input/output lines for transmitting data signals. Input/output lines may be divided into segment input/output lines, local input/output lines, global input/output lines based on their locations and lengths. Generally, line loading times for the input/output lines may gradually increase as the miniaturization and capacities of semiconductor devices increases. Particularly, since global input/output lines are relatively long lines and have higher loading times, loss and distortion of the data signals may occur. Accordingly, improved technologies for minimizing current consumption while preventing loss and distortion of data signals are desirable.

SUMMARY

Exemplary embodiments of the present invention are directed to a semiconductor device having an optimized path for transmitting data signals.

According to with an embodiment of the present invention, a semiconductor device may include: an input/output block suitable for operating by using a first voltage in an input mode and a second voltage in an output mode; a common input/output line coupled to the input/output block; and a voltage level maintaining block suitable for driving the common input/output line to maintain a voltage level of a transmission signal by using the first voltage in the input mode and the second voltage in the output mode.

The input/output block may include: an input unit suitable for operating by using a first voltage; and an output unit suitable for operating by using a second voltage.

The first voltage may be lower than the second voltage.

The voltage level maintaining block may include: a first latch unit suitable for operating by using the first voltage; a second latch unit suitable for operating by using the second voltage; and a selective coupling unit suitable for coupling one of the first and second latch units to the common Input/output line based on a mode determination signal for determining the input mode and the output mode.

The semiconductor device may further include: a mode control block suitable for generating the mode determination signal based on a first command signal related to the input mode and a second command signal related to the output mode.

The voltage level maintaining block may include: a latch unit coupled to the common input/output line; and a selective supply unit suitable for supplying one of the first and second voltages as a source voltage of the latch unit based on a mode determination signal for determining the input mode and the output mode.

The semiconductor device may further include: a mode control block suitable for generating the mode determination signal based on a first command signal related to the input mode and a second command signal related to the output mode.

According to with another embodiment of the present invention, a semiconductor device may include: a memory block where an internal write data signal is written to and an internal read data signal is read from; a write path suitable for operating by using a first voltage to transmit the internal write data signal corresponding to an external write data signal to the memory block; a read path suitable for operating by using a second voltage to transmit the internal read data signal to an outside; and a voltage level maintaining block suitable for driving the write path to maintain a voltage level of the internal write data signal by using the first voltage in a write mode and driving the read path to maintain a voltage level of the internal read data signal by using the second voltage in a read mode.

The first voltage may be lower than the second voltage.

The write path and the read path may share a first common input/output line.

The voltage level maintaining block may include: a first latch unit suitable for operating by using the first voltage; a second latch unit suitable for operating by using the second voltage; and a selective coupling unit suitable for coupling one of the first and second latch units to the first common input/output line based on a mode determination signal determining the write mode or the read mode.

The semiconductor device may further include: a mode control block suitable for generating the mode determination signal based on a write command signal and a read command signal.

The voltage level maintaining block may include: a latch unit coupled to the first common input/output line; and a selective supply unit suitable for supplying one of the first and second voltages as a source voltage of the latch unit based on a mode determination signal determining the write mode or the read mode.

The semiconductor device may further include: a mode control block suitable for generating the mode determination signal based on a write command signal and a read command signal.

The write path may include: an input unit suitable for receiving the external write data signal based on the first voltage; said first common input/output line; a second common input/output line suitable for transmitting the internal write data signal to the memory block; and a write driving unit suitable for driving the second common input/output line based on the internal write data signal transmitted from the first common input/output line by using the first voltage.

The read path may include: said first and second common input/output lines; a read amplification unit suitable for driving the first common input/output line based on the internal read data signal transmitted from the second common input/output line by using the second voltage; and an output unit suitable for outputting the internal read data signal to the outside.

The write path may include: an input unit suitable for receiving the external write data signal based on the first voltage; a write input/output line suitable for transmitting the internal write data signal; a common input/output line suitable for transmitting the internal write data signal to the memory block; and a write driving unit suitable for driving the common input/output line based on the internal write data signal transmitted from the write input/output line by using the first voltage.

The read path may include: said common input/output line; a read input/output line suitable for transmitting the read data signal; a read amplification unit suitable for driving the read input/output line based on the internal read data signal transmitted from the common input/output line by using the second voltage; an output unit suitable for outputting the read data signal to the outside.

The voltage level maintaining block may include: a first latch unit suitable for operating by using the first voltage; and a second latch unit suitable for operating by using the second voltage.

According to with another embodiment of the present invention, a method for driving a semiconductor device may include: driving, in a write mode, a common input/output line, shared by a write path and a read path, to maintain a level of a write data signal by using a first voltage; and driving, in a read mode, the common input/output line to maintain a level of a read data signal by using a second voltage that is higher than the first voltage.

In the driving the common input/output line based on the first voltage, a first latch unit using the first voltage as a source voltage may be coupled to the common input/output line or the first voltage may be supplied as a source voltage of a latch unit coupled to the common input/output line.

In the driving the common input/output line based on the second voltage, a second latch unit using the second voltage as a source voltage may be coupled to the common input/output line or the second voltage may be supplied as a source voltage of a latch unit coupled to the common input/output line.

DETAILED DESCRIPTION

Various embodiments of the present invention are described below in more detail with reference to the accompanying drawings. These embodiments are provided so that this disclosure is thorough and complete, and fully convey the present invention to those skilled in the art. Hence, the embodiments presented are merely examples and are not intended to limit the invention.

Moreover, it is noted that the terminology used herein is for the purpose of describing the embodiments only and is not intended to be limiting the invention. As used herein, the singular forms "a", "an" and "the" are intended to include the plural forms as well, unless the context clearly indicates otherwise. It will be further understood that the terms "comprises," "comprising," "may include," and/or "including" when used in this specification, indicate the presence of stated features, but do not preclude the presence or addition of one or more other features. As used herein, the term "and/or" indicates any and all combinations of one or more of the associated listed items.

A semiconductor device such as a Double Data Rate Synchronous Dynamic Random Access Memory (DDR SDRAM) is described as an example of the present invention, however, the invention is not limited to DDR SDRAM memory devices.

Figure 1:
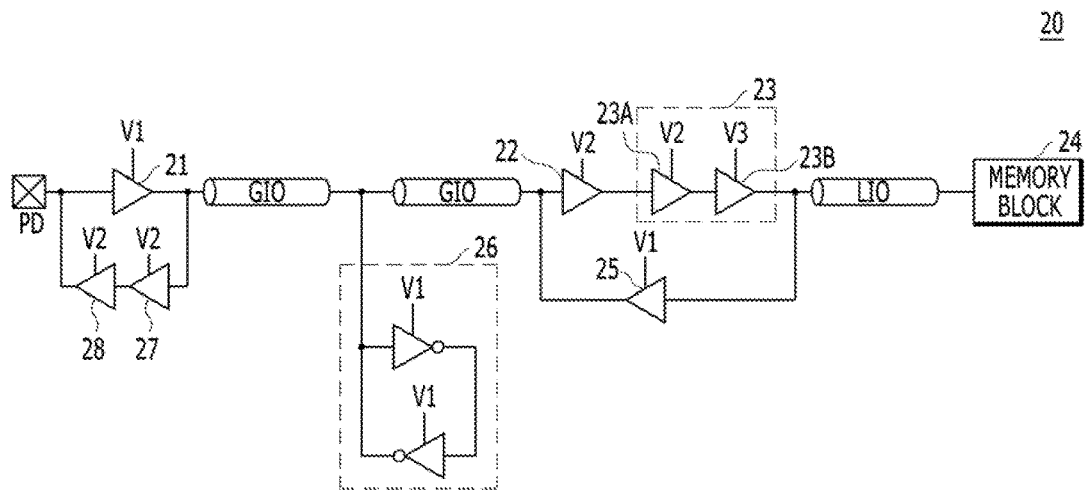
FIG. 1 is a diagram illustrating a semiconductor device according to a comparative example of the present invention.

Referring to FIG. 1, the semiconductor device 20, according to a comparative example of the invention, may include a receiver 21, a first level shifter 22, a write driving block 23, a memory block 24, a read amplification block 25, a voltage level maintaining block 26, a second level shifter 27, a transmitter 28, a first common input/output line GI0, and a second common input/output line LI0.

Accordingly, the receiver 21 may receive an external write data signal through a pad PD and output a write data signal, corresponding to the external write data signal, to the first common input/output line GI0. The receiver 21 may use a first voltage V1 as a source voltage. For example, the first voltage V1 may be a peripheral voltage VPERI that is lower than a power source voltage VDD. The receiver 21 may be enabled in a write mode.

The first level shifter 22 may receive the write data signal having a voltage range corresponding to the first voltage V1, and may shift the write data signal to swing in a range corresponding to a second voltage V2. For example, the second voltage V2 may be the power source voltage VDD.

The write driving block 23 is enabled in the write mode and may include a write driver 23A and a local line driver 23B. The write driver 23A may receive the write data signal level-shifted through the first level shifter 22 and generates a pre-internal write data signal corresponding to the write data signal. The write driver 23A may use the second voltage V2 as a source voltage. The local line driver 23B may receive the pre-internal write data signal and output an internal write data signal corresponding to the pre-internal write data signal to the second common input/output line LI0. The local line driver 23B may use a third voltage V3 as a source voltage. For example, the third voltage V3 may include a core voltage VCORE that is lower than the first voltage V1.

The memory block 24 writes the internal write data signal transmitted through the second common input/output line LI0 in the write mode and reads an internal read data signal to the second common input/output line LI0 in a read mode.

The read amplification block 25 may receive the internal read data signal transmitted through the second common input/output line LI0 and output a read data signal corresponding to the internal read data signal to the first common input/output line GI0. The read amplification block 25 may use the peripheral voltage VPERI as a source voltage. The read amplification block 25 is enabled in the read mode.

The voltage level maintaining block 26 is coupled to the first common input/output line GI0. The voltage level maintaining block 26 maintains voltage levels of the write data signal and the read data signal transmitted through the first common input/output line GI0. The voltage level maintaining block 26 may use the first voltage V1 corresponding to swing levels of the write data signal and the read data signal as a source voltage. For example, the voltage level maintaining block 26 may include a latch unit using the first voltage V1 as a source voltage.

The second level shifter 27 may receive the read data signal that swings in the range corresponding to the first voltage V1, and may shift the read data signal to swing in the range corresponding to the second voltage V2.

The transmitter 28 may receive read data signal transmitted through the first common Input/output line GI0 after being level-shifted through the second level shifter 27, and output an external read data signal corresponding to the read data signal to an external device through the pad PD. The transmitter 28 may use the second voltage V2 as a source voltage. The transmitter 28 may be enabled in the read mode.

The first common input/output line GI0 may include a global Input/output line.

The second common input/output line LI0 may include a local input/output line.

The semiconductor device 20 may prevent loss or distortion of write and/or read data signals by means of the voltage level maintaining block 26 when write and/or read data signals are transmitted through the first common input/output line GI0. Further, since the receiver 21, the read amplification block 25 and the voltage level maintaining block 26 may use the first voltage V1 that is lower than the second voltage V2 as a source voltage, a driving current for driving the first common input/output line GI0 may be reduced.

However, the semiconductor device 20 includes the first level shifter 22 before the write driving block 23 and the second level shifter 27 before the transmitter 28. Hence, a delay corresponding to the first level shifter 22 may be added to a write path, and a delay corresponding to the second level shifter 27 may be added to a read path. Consequently, the semiconductor device 20 may exhibit increased latencies related to the write and read modes tWR, tAA.

Figure 2:
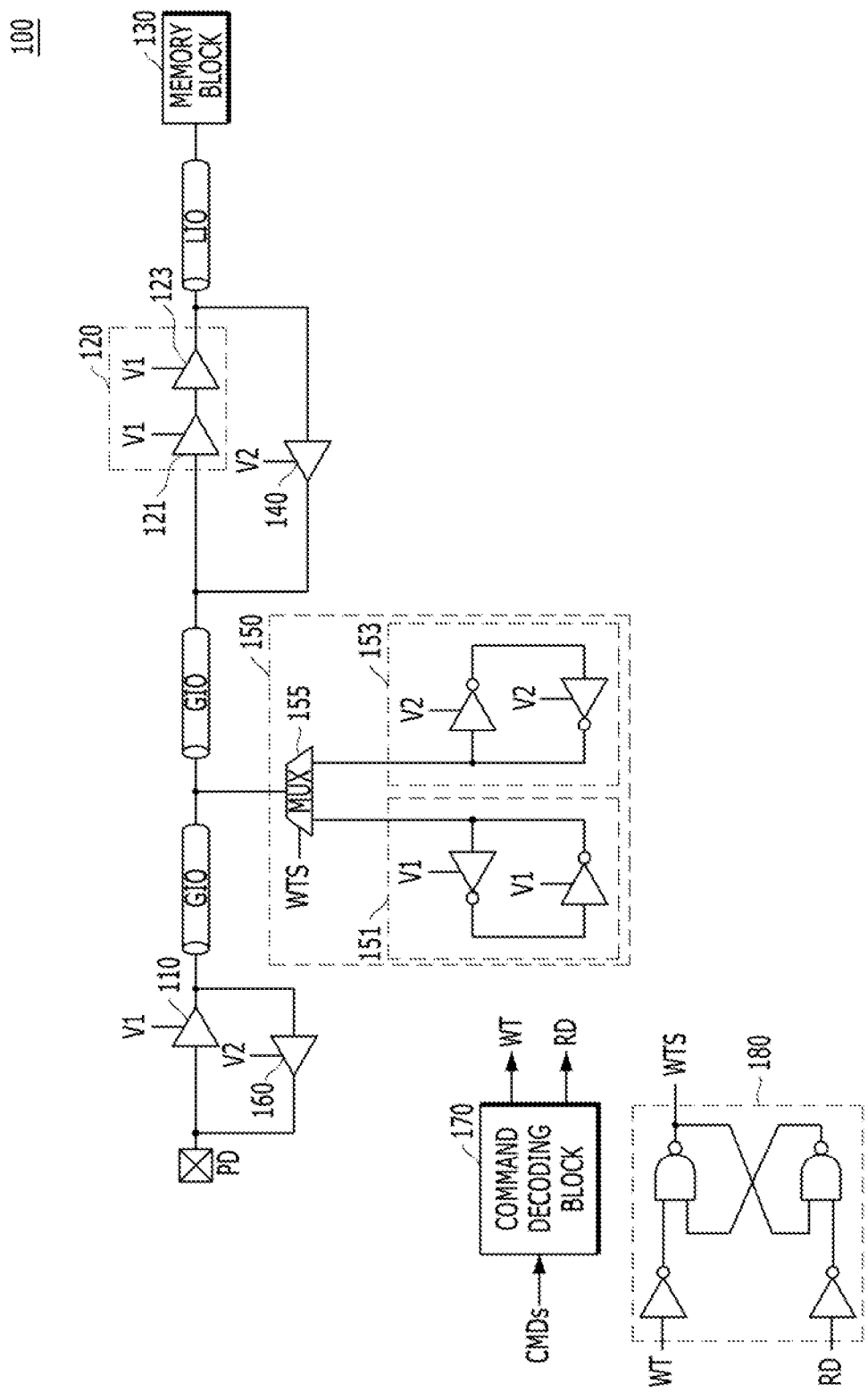
FIG. 2 is a diagram illustrating a semiconductor device, according to with an embodiment of the present invention.

FIG. 2 is a diagram illustrating a semiconductor device 100, according to an embodiment of the present invention.

Referring to FIG. 2, the semiconductor device 100 may include a pad PD, a write path 110, GI0, 120 and LI0, a memory block 130, a read path LI0, 140, GI0 and 160, and a voltage level maintaining block 150.

The pad PD may transmit an external write data signal inputted from an external device to the write path 110, GI0, 120 and LI0 and/or an external read data signal outputted from the read path LI0, 140, GI0 and 160 to the external device.

The write path 110, GI0, 120 and LI0 and the read path LI0, 140, GI0 and 160 may share a first common input/output line (i.e., a global line) GI0 and a second common input/output line (i.e., a local line) LI0.

The first common input/output line GI0 may transmit signals in both directions. In other words, the first common input/output line GI0 may transmit a write data signal in a first direction in a write mode and a read data signal to a second direction in a read mode. For example, the first common input/output line GI0 may include a global input/output line.

The write mode may include an input mode where the external write data signal is inputted to the semiconductor device 100. The read mode may include an output mode where the external read data signal is outputted to the external device.

The second common input/output line LI0 may transmit signals in both directions. In other words, the second common input/output line LI0 may transmit an internal write data signal in a first direction in the write mode and an internal read data signal to a second direction in the read mode. For example, the second common input/output line LI0 may include a local input/output line.

The write path 110, GI0, 120 and LI0 may use a first voltage V1 that is lower than a second voltage V2 as a source voltage. For example, the first voltage V1 may include a core voltage VCORE, and the second voltage V2 may include a power source voltage VDD. The write path 110, GI0, 120 and LI0 may include an input unit (i.e., a receiver) 110, the first common input/output line GI0, a write driving unit 120, and/or the second common input/output line LI0.

The input unit 110 may receive an external write data signal and output a write data signal corresponding to the external write data signal to the first common input/output line GI0. The input unit 110 may use the first voltage V1 as a source voltage. The input unit 110 may be enabled in the write mode.

The write driving unit 120 may be enabled in the write mode. The write driving unit 120 may include a write driver 121 and a local line driver 123. The write driver 121 may receive the write data signal and generate a pre-internal write data signal corresponding to the write data signal. The write driver 121 may use the first voltage V1 as a source voltage. The local line driver 123 may receive the pre-internal write data signal and output the internal write data signal corresponding to the pre-internal write data signal to the second common input/output line LI0. The local line driver 123 may use the first voltage V1 as a source voltage.

The memory block 130 may write the internal write data signal transmitted through the second common input/output line LI0 in the write mode and read the internal read data signal to the second common input/output line LI0 in the read mode.

The read path LI0, 140, GI0 and 160 may use the second voltage V2 as a source voltage. The read path LI0, 140, GI0 and 160 may include the second common input/output line LI0, a read amplification unit 140, the first common input/output line GI0, and an output unit (i.e., a transmitter) 160.

The read amplification unit 140 may receive the internal read data signal transmitted through the second common input/output line LI0 and output a read data signal corresponding to the internal read data signal to the first common input/output line GI0. The read amplification unit 140 may use the second voltage V2 as a source voltage. The read amplification unit 140 may be enabled in the read mode.

The output unit 160 may receive the read data signal transmitted through the first common input/output line GI0 and output the external read data signal corresponding to the read data signal to the external device through the pad PD. The output unit 160 may use the second voltage V2 as a source voltage. The output unit 160 may be enabled in the read mode.

The voltage level maintaining block 150 may be coupled to the first common input/output line GI0. The voltage level maintaining block 150 may maintain a voltage level of the first common input/output line GI0 based on different voltages in the write and read modes. In other words, the voltage level maintaining block 150 may use the first voltage V1 corresponding to a swing level of the write data signal as a source voltage when the write data signal is transmitted through the first common input/output line GI0. The voltage level maintaining block 150 may use the second voltage V2 corresponding to a swing level of the read data signal as a source voltage when the read data signal is transmitted through the first common input/output line GI0.

For example, the voltage level maintaining block 150 may include a first latch unit 151, a second latch unit 153, and a selective coupling unit 155. The first latch unit 151 may use the first voltage V1 as a source voltage. The second latch unit 153 may use the second voltage V2 as a source voltage. The selective coupling unit 155 may couple one of the first and second latch units 151 and 153 to the first common input/output line GI0 based on a mode determination signal WTS for determining the write mode and the read mode. For example, the selective coupling unit 155 may couple the first latch unit 151 to the first common input/output line GI0 in the write mode and the second latch unit 153 to the first common input/output line GI0 in the read mode based on the mode determination signal WTS.

The semiconductor device 100 may further include a command decoding block 170 and a mode control block 180.

The command decoding block 170 may decode command signals CMDs to generate a write command signal WT and a read command signal RD. The write command signal WT may be related to the write mode. The read command signal RD may be related to the read mode.

The mode control block 180 may generate the mode determination signal WTS based on the write command signal WT and/or the read command signal RD. For example, the mode control block 180 may include an RS latch.

Figure 3:
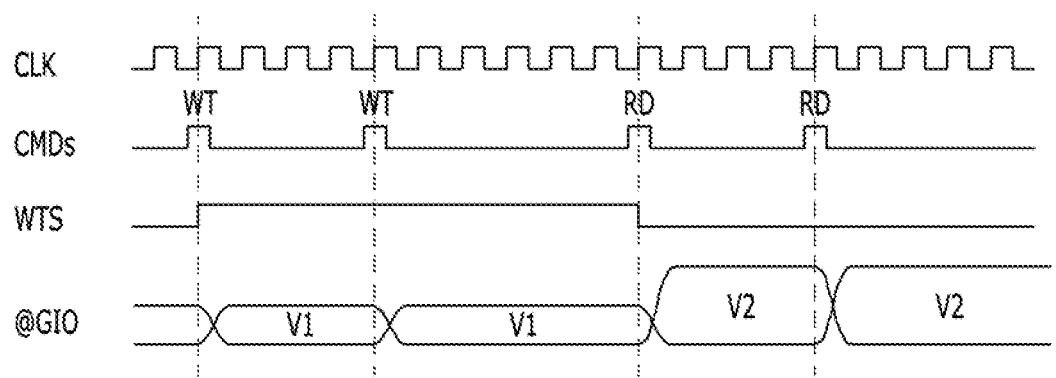
FIG. 3 is a timing diagram for describing an operation of the semiconductor device shown in FIG. 2.

FIG. 3 is a timing diagram for describing an operation of the semiconductor device 100 shown in FIG. 2.

First of all, an operation of the semiconductor device 100 in the write mode is described.

Referring to FIG. 3, the command decoding block 170 may activate the write command signal WT based on the command signals CMDs. The mode control block 180 may generate the mode determination signal WTS based on the write command signal WT. For example, the mode control block 180 may generate the mode determination signal WTS having a high logic level in response to the write command signal WT. Consequently, the voltage level maintaining block 150 may maintain a voltage level of the first common input/output line GI0 based on the first voltage V1 as a source voltage. For example, the selective coupling unit 155 may couple the first latch unit 151 using the first voltage V2 as a source voltage to the first common input/output line GI0 based on the mode determination signal WTS.

When the external write data signal is inputted through the pad PD, the input unit 110 may generate the write data signal corresponding to the external write data signal and output the write data signal to the first common input/output line GI0.

The first common input/output line GI0 may transmit the write data signal to the write driving unit 120. The write data signal may have a swing level corresponding to the first voltage V1. The voltage level maintaining block 150 may maintain a voltage level of the write data signal when the write data signal is transmitted through the first common input/output line GI0.

When the write data signal is transmitted through the first common input/output line GI0, the write driving unit 120 may generate the internal write data signal corresponding to the write data signal and output the internal write data signal to the second common input/output line LI0.

The memory block 130 may write the internal write data signal transmitted through the second common input/output line LI0.

Next, an operation of the semiconductor device 100 in the read mode is described.

Continuously referring to FIG. 3, the command decoding block 170 may activate the read command signal RD based on the command signals CMDs. The mode control block 180 may generate the mode determination signal WTS based on the read command signal RD. For example, the mode control block 180 may generate the mode determination signal WTS having a low level logic in response to the read command signal RD. Consequently, the voltage level maintaining block 150 may maintain a voltage level of the first common input/output line GI0 based on the second voltage V2 as a source voltage. For example, the selective coupling unit 155 may couple the second latch unit 153 using the second voltage V2 as a source voltage to the first common input/output line GI0 based on the mode determination signal WTS.

For example, the memory block 130 may read the internal read data signal to the second common input/output line LI0. When the internal read data signal is transmitted through the second common input/output line LI0, the read amplification unit 140 may generate the read data signal corresponding to the Internal read data signal and output the read data signal to the first common input/output line GI0.

The first common input/output line GI0 may transmit the read data signal to the output unit 160. The read data signal may have a swing level corresponding to the second voltage V2. The voltage level maintaining block 150 may maintain a voltage level of the read data signal when the read data signal is transmitted through the first common input/output line GI0.

Figure 4:
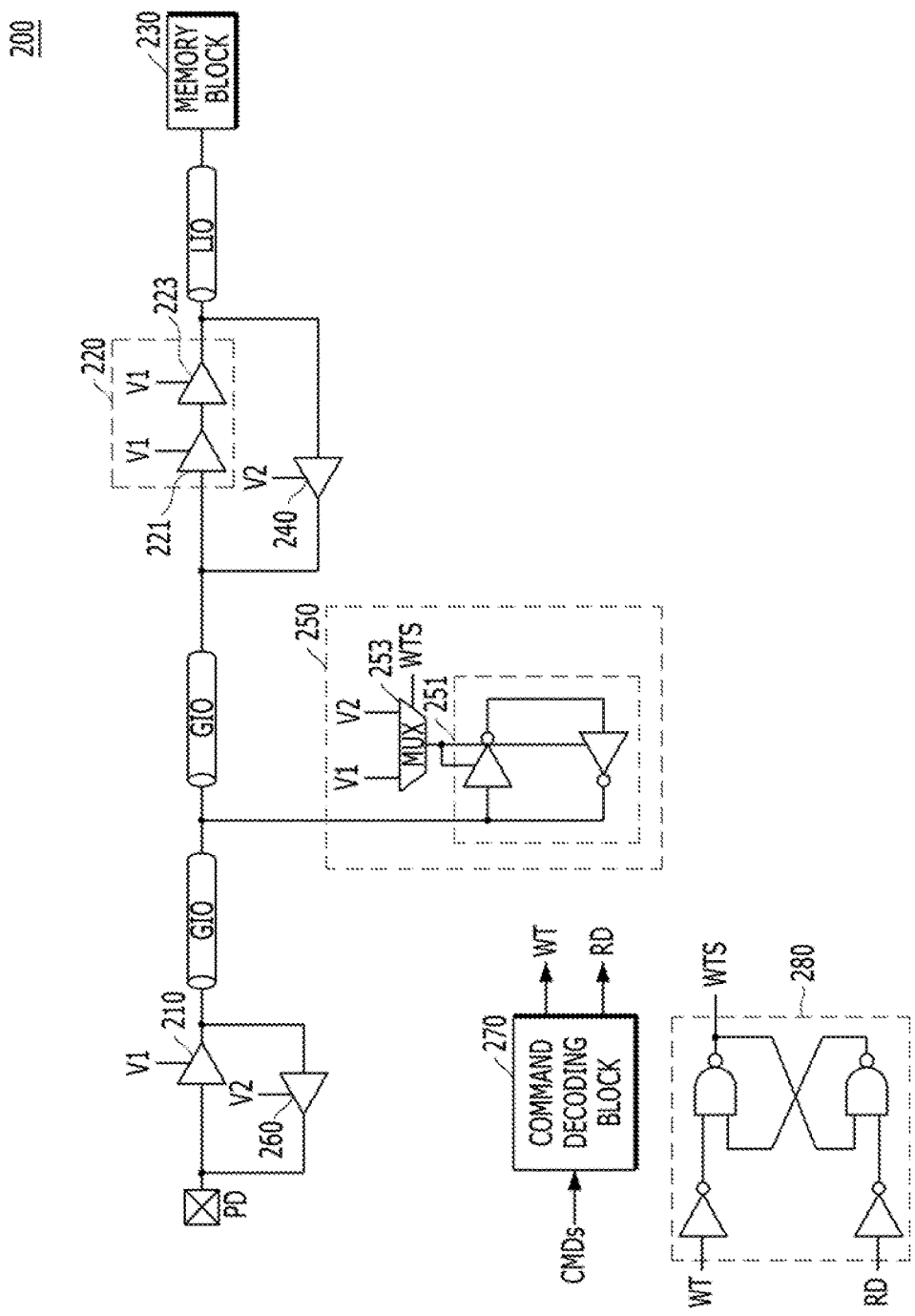
FIG. 4 is a diagram illustrating a semiconductor device, according to another embodiment of the present invention.

FIG. 4 is a diagram illustrating a semiconductor device 200, according to another embodiment of the present invention.

Referring to FIG. 4, the semiconductor device 200 may include a pad PD, a write path 210, GI0, 220 and LI0, a memory block 230, a read path LI0, 240, GI0 and 260, a voltage level maintaining block 250, a command decoding block 270, and/or a mode control block 280.

The pad PD, the write path 210, GI0, 220 and LI0, the memory block 230, the read path LI0, 240, GI0 and 260, the command decoding block 270 and the mode control block 280 may have the same structure as the pad PD, the write path 110, GI0, 120 and LI0, the memory block 130, the read path LI0, 140, GI0 and 160, the command decoding block 170 and the mode control block 180 included in the embodiment of FIG. 2. Therefore, detailed descriptions on the pad PD, the write path 210, GI0, 220 and LI0, the memory block 230, the read path LI0, 240, GI0 and 260, the command decoding block 270 and the mode control block 280 are omitted. The voltage level maintaining block 250 is described in detail below.

The voltage level maintaining block 250 may be coupled to a first common input/output line GI0. The voltage level maintaining block 250 may maintain a voltage level of the first common input/output line GI0 based on different voltages in write and read modes. In other words, the voltage level maintaining block 250 may use a first voltage V1 corresponding to a swing level of a write data signal as a source voltage when the write data signal is transmitted through the first common input/output line GI0. The voltage level maintaining block 250 may use a second voltage V2 corresponding to a swing level of a read data signal as a source voltage when the read data signal is transmitted through the first common input/output line GI0. For example, the first voltage V1 may include a core voltage VCORE that is lower than a power source voltage VDD, and the second voltage V2 may include the power source voltage VDD.

The voltage level maintaining block 250 may include a latch unit 251 and a selective supply unit 253. The latch unit 251 may be coupled to the first common input/output line GI0. The selective supply unit 253 may supply one of the first and second voltages V1, V2 as a source voltage of the latch unit 251 based on a mode determination signal WTS for determining the write mode and the read mode. For example, the selective supply unit 253 may supply the first voltage V1 as a source voltage to the latch unit 251 in a write mode and the second voltage V2 as a source voltage to the latch unit 251 in the read mode based on the mode determination signal WTS.

Hereinafter, an operation of the semiconductor device 200 focused on an operation of the voltage level maintaining block 250, which is different from the operation of the semiconductor device 100, is described.

Accordingly when the semiconductor device 200 enters a write mode, the command decoding block 270 may activate a write command signal WT based on command signals CMDs. The mode control block 280 may generate the mode determination signal WTS based on the write command signal WT. For example, the mode control block 280 may generate the mode determination signal WTS having a high logic level in response to the write command signal WT. Consequently, the voltage level maintaining block 250 may maintain a voltage level of the first common input/output line GI0 based on the first voltage V1 as a source voltage. For example, the selective supply unit 253 may supply the first voltage V1 among the first and second voltages V1, V2 as a source voltage to the latch unit 251 based on the mode determination signal WTS, and the latch unit 251 may maintain the voltage level of the first common input/output line GI0 based on the first voltage V1 as a source voltage.

When the semiconductor device 200 enters the read mode, the command decoding block 270 may activate a read command signal RD based on the command signals CMDs. The mode control block 280 may generate the mode determination signal WTS based on the read command signal RD. For example, the mode control block 280 may generate the mode determination signal WTS having a low level logic in response to the read command signal RD. Consequently, the voltage level maintaining block 250 may maintain the voltage level of the first common input/output line GI0 based on the second voltage V2 as a source voltage. For example, the selective supply unit 253 may supply the second voltage V2 as a source voltage to the latch unit 251 based on the mode determination signal WTS, and the latch unit 251 may maintain the voltage level of the first common input/output line GI0 based on the second voltage V2 as a source voltage.

Figure 5:
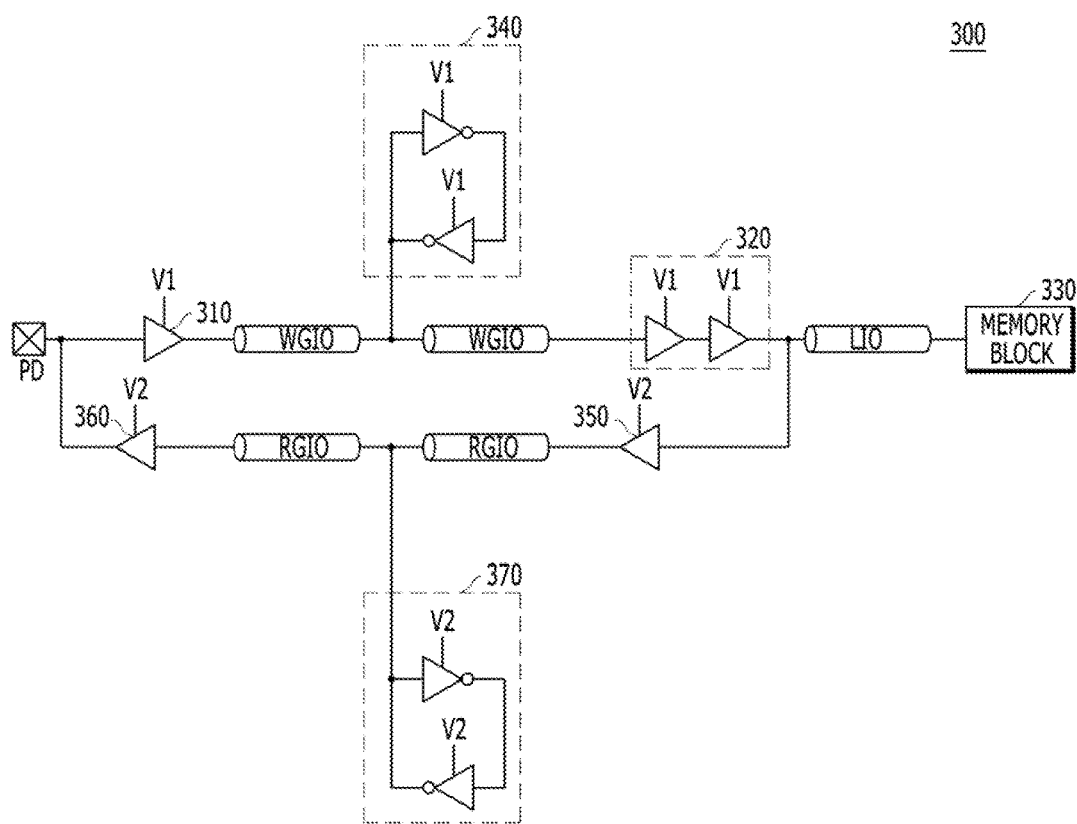
FIG. 5 is a diagram illustrating a semiconductor device, according to yet another embodiment of the present invention.

FIG. 5 is a diagram illustrating a semiconductor device according to an embodiment of the invention.

Referring to FIG. 5, the semiconductor device 300 may include a pad PD, a write path 310, WGI0, 320 and LI0, a memory block 330, a read path LI0, 350, RGI0 and 360, and voltage level maintaining blocks 340 and 370.

The pad PD may transmit an external write data signal inputted from an external device to the write path 310, WGI0, 320 and LI0 and an external read data signal outputted from the read path LI0, 350, RGI0 and 360 to the external device.

The write path 310, WGI0, 320 and LI0 and the read path LI0, 350, RGI0 and 360 may share a common input/output line LI0.

The common input/output line LI0 may transmit signals in both directions. In other words, the common input/output line LI0 may transmit an internal write data signal in a first direction in a write mode and an internal read data signal to a second direction in a read mode. For example, the common input/output line LI0 may include a local input/output line.

The write path 310, WGI0, 320 and LI0 may use a first voltage V1 that is lower than a second voltage V2 as a source voltage. For example, the first voltage V1 may include a core voltage VCORE that is lower than a power source voltage VDD, and the second voltage V2 may include the power source voltage VDD. The write path 310, WGI0, 320 and LI0 may include an input unit (i.e., a receiver) 310, a write input/output line WGI0, a write driving unit 320, and the common input/output line LI0.

The input unit 310 may receive an external write data signal and output the write data signal corresponding to the external write data signal to the write input/output line WGI0. The input unit 310 may use the first voltage V1 as a source voltage. The input unit 310 may be enabled in the write mode.

The write input/output line WGI0 may include a write global input/output line for transmitting the write data signal.

The write driving unit 320 may be enabled in the write mode. The write driving unit 320 may include a write driver 321 and a local line driver 323. The write driver 321 may receive the write data signal and generate a pre-internal write data signal corresponding to the write data signal. The write driver 321 may use the first voltage V1 as a source voltage. The local line driver 323 may receive the pre-internal write data signal and output the internal write data signal corresponding to the pre-internal write data signal to the common input/output line LI0. The local line driver 323 may use the first voltage V1 as a source voltage.

The memory block 330 may write the internal write data signal transmitted through the common input/output line LI0 in the write mode and read the internal read data signal to the common input/output line LI0 in the read mode.

The read path LI0, 350, RGI0 and 360 may use the second voltage V2 as a source voltage. The read path LI0, 350, RGI0 and 360 may include the common input/output line LI0, a read amplification unit 350, a read input/output line RGI0, and an output unit (i.e., a transmitter) 360.

The read amplification unit 350 may receive an internal read data signal transmitted through the common input/output line LI0 and output a read data signal corresponding to the internal read data signal to the read input/output line RGI0. The read amplification unit 350 may use the second voltage V2 as a source voltage. The read amplification unit 350 may be enabled in the read mode.

The read input/output line RGI0 may include a read global input/output line for transmitting the read data signal.

The output unit 360 may receive the read data signal transmitted through the read input/output line RGI0 and output the external read data signal corresponding to the read data signal to the external device through the pad PD. The output unit 360 may use the second voltage V2 as a source voltage. The output unit 360 may be enabled in the read mode.

The voltage level maintaining blocks 340 and 370 may maintain the voltage levels of the write input/output line WGI0 and the read input/output line RGI0 based on different voltages in the write mode and the read mode. For example, the voltage level maintaining blocks 340 and 370 may use the first voltage V1 corresponding to a swing level of the write data signal as a source voltage when the write data signal is transmitted through the write input/output line WGI0 and the second voltage V2 corresponding to a swing level of the read data signal as a source voltage when the read data signal is transmitted through the read input/output line RGI0.

For example, the voltage level maintaining blocks 340 and 370 may include a first and a second latch units 340, 370. The first latch unit 340 may be coupled to the write input/output line WGI0. The first latch unit 340 may use the first voltage V1 as a source voltage. The second latch unit 370 may be coupled to the read input/output line RGI0. The second latch unit 370 may use the second voltage V2 as a source voltage.

Hereinafter, an operation of the semiconductor device 300, for example, focused on an operation of the write mode, is described.

When the external write data signal is inputted through the pad PD, the input unit 310 may generate the write data signal corresponding to the external write data signal and output the write data signal to the write input/output line WGI0.

The write input/output line WGI0 may transmit the write data signal to the write driving unit 320. The write data signal may have a swing level corresponding to the first voltage V1. The voltage level maintaining blocks 340 and 370 may maintain a voltage level of the write data signal when the write data signal is transmitted through the write input/output line WGI0. For example, the first latch unit 340 may maintain the voltage level of the write data signal based on the first voltage V1 as a source voltage.

When the write data signal is transmitted through the write input/output line WGI0, the write driving unit 320 may generate the internal write data signal corresponding to the write data signal and output the internal write data signal to the common input/output line LI0.

The memory block 330 may write an internal write data signal transmitted through the common input/output line LI0.

The memory block 330 may read an internal read data signal to the common input/output line LI0. When an internal read data signal is transmitted through the common input/output line 10, the read amplification unit 350 may generate a read data signal corresponding to the internal read data signal and output the read data signal to the read input/output line RGI0.

The read input/output line RGI0 may transmit the read data signal to the output unit 360. The read data signal may have a swing level corresponding to the second voltage V2. The voltage level maintaining blocks 340 and 370 may maintain a voltage level of the read data signal when the read data signal is transmitted through the read input/output line RGI0. For example, the second latch unit 370 may maintain the voltage level of the read data signal based on the second voltage V2 as a source voltage.

According to embodiments of the present invention, a write path may use a core voltage lower which is lower than a power source voltage as a source voltage. As a result, a driving current for driving an input/output line may decrease. Also latencies related to a write and/or a read modes, tWR and tAA, may not increase because a level shifter may be excluded from the write and/or read paths.

According to embodiments of the present invention, a path for transmitting a data signal is optimized, distortion and loss of the data signal may be minimized, and a driving current required for transmission of the data signal and latency may be also minimized.

While the present invention has been described with respect to specific embodiments, the embodiments are not intended to be restrictive. Further, it is noted that the present invention may be achieved in various ways through substitution, change, and modification, by those skilled in the art without departing from the scope of the present invention as defined by the following claims.

What is claimed is:

1. A semiconductor device, comprising:
   an input/output circuit configured to operate by using a first voltage in an input mode and a second voltage in an output mode;
   a common input/output coupled to the input/output circuit; and
   a voltage level maintaining circuit configured to drive the common input/output line to maintain a voltage level of a transmission signal by using the first voltage lower than the second voltage in the input mode and the second voltage in the output mode based on a mode determination signal for determining the input mode and the output mode,
   wherein the voltage level maintaining circuit includes:
   a first latch circuit configured to operate by using the first voltage;
   a second latch circuit configured to operate by using the second voltage; and
   a selective couple circuit configured to couple one of the first and second latch circuits to the common input/output line based on the mode determination signal.

2. The semiconductor device of claim 1, wherein the input/output circuit includes:
   an input circuit configured to operate by using the first voltage; and
   an output circuit configured to operate by using the second voltage.

3. The semiconductor device of claim 1, further comprising:
   a mode control circuit configured to generate the mode determination signal based on a first command signal related to the input mode and a second command signal related to the output mode.

4. The semiconductor device of claim 1, further comprising:
   a write driving circuit formed between the common input/output line, coupled to the input/output circuit, and a local input/output line coupled to a memory circuit where an internal write data signal is written to and an internal read data signal is read from.

5. A semiconductor device, comprising:
   an input/output circuit configured to operate by using a first voltage in an input mode and a second voltage in an output mode;
   a common input/output line coupled to the input/output circuit; and
   a voltage level maintaining circuit configured to drive the common input/output line to maintain a voltage level of a transmission signal by using the first voltage lower than the second voltage in the input mode and the second voltage in the output mode based on a mode determination signal for determining the input mode and the output mode,
   wherein the voltage level maintaining circuit includes:
   a latch circuit coupled to the common input/output line; and
   a selective supply circuit configured to supply one of the first and second voltages as a source voltage of the latch circuit based on the mode determination signal.

6. The semiconductor device of claim 5, further comprising:

a mode control circuit configured to generate the mode determination signal based on a first command signal related to the input mode and a second command signal related to the output mode.

7. A semiconductor device, comprising:
a memory circuit where an internal write data signal is written to and an internal read data signal is read from;
a write path configured to operate by using a first voltage to transmit the internal write data signal corresponding to an external write data signal to the memory circuit;
a read path configured to operate by using a second voltage to transmit the internal read data signal to an outside; and
a voltage level maintaining circuit configured to drive the write path to maintain a voltage level of the internal write data signal by using the first voltage lower than the second voltage in a write mode and drive the read path to maintain a voltage level of the internal read data signal by using the second voltage in a read mode based on a mode determination signal for determining the write mode or the read mode,
wherein the first voltage is lower than the second voltage,
wherein the voltage level maintaining circuit includes:
a first latch circuit configured to operate by using the first voltage:
a second latch circuit configured to operate by using the second voltage: and
a selective coupling circuit configured to couple one of the first and second latch circuits to the first common input/output line based on the mode determination signal.

8. The semiconductor device of claim 7, wherein the write path and the read path share a first common input/output line.

9. The semiconductor device of claim 8, wherein the write path includes;
an input circuit configured to receive the external write data signal based on the first voltage;
said first common input/output line;
a second common input/output line configured to transmit the internal write data signal to the memory circuit; and
a write driving circuit configured to drive the second common input/output line based on the internal write data signal transmitted from the first common input/output line by using the first voltage.

10. The semiconductor device of claim 9, wherein the read path includes:
said first and second common output lines;
a read amplification circuit configured to drive the first common input/output line based on the internal read data signal transmitted from the second common input/output line by using the second voltage; and
an output circuit configured to output the internal read data signal to the outside.

11. The semiconductor device of claim 7, further comprising:
a mode control circuit configured to generate the mode determination signal based on a write command signal and a read command signal.

12. The semiconductor device of claim 7, wherein the write path includes:
an input circuit configured to receive the external write data signal based on the first voltage;
a write input/output line configured to transmit the internal write data signal; a common input/output line configured to transmit the internal write data signal to the memory circuit; and
a write driving circuit configured to drive the common input/output line based on the internal write data signal transmitted from the write input/output line by using the first voltage.

13. The semiconductor device of claim 12, wherein the read path includes:
said common input/output line;
a read input/output line configured to transmit the read data signal;
a read amplification circuit configured to drive the read input/output line based on the internal read data signal transmitted from the common input/output line by using the second voltage;
an output circuit configured to output the read data signal to the outside.

14. The semiconductor device of claim 13, wherein the voltage level maintaining circuit includes:
a first latch circuit configured to operate by using the first voltage; and
a second latch circuit configured to operate by using the second voltage.

15. A semiconductor device, comprising:
a memory circuit where an internal write data signal is written to and an internal read data signal is read from;
a write path configured to operate by using a first voltage to transmit the internal write data signal corresponding to an external write data signal to the memory circuit;
a read path configured to operate by using a second voltage to transmit the internal read data signal to an outside; and
a voltage level maintaining circuit configured to drive the write path to maintain a voltage level of the internal write data signal by using the first voltage lower than the second voltage in a write mode and drive the read path to maintain a voltage level of the internal read data signal by using the second voltage in a read mode based on a mode determination signal for determining the write mode or the read mode,
wherein the first voltage is lower than the second voltage,
wherein the voltage level maintaining circuit includes:
a latch circuit coupled to the first common input/output line; and
a selective supply circuit configured to supply one of the first and second voltages as a source voltage of the latch circuit based on a mode determination signal.

16. The semiconductor device of claim 15, further comprising:
a mode control circuit configured to generate the mode determination signal based on a write command signal and a read command signal.

* * * * *